United States Patent [19]

Armstrong

[11] Patent Number: 5,029,281
[45] Date of Patent: Jul. 2, 1991

[54] CLIPPING CIRCUIT

[75] Inventor: Stephen W. Armstrong, Burlington, Canada

[73] Assignee: Gennum Corporation, Burlington, Canada

[21] Appl. No.: 354,327

[22] Filed: May 19, 1989

[51] Int. Cl.$^5$ .............................................. H03K 5/08
[52] U.S. Cl. .................................. 307/555; 307/562; 307/567
[58] Field of Search ............... 307/553, 555, 557, 560, 307/562, 567, 540; 330/288

[56] References Cited

U.S. PATENT DOCUMENTS 3,500,067  3/1970  Davis et al. ........................ 307/553
3,974,400  8/1976  Takeda et al. ...................... 307/553

FOREIGN PATENT DOCUMENTS 0134915  8/1984  Japan .................................. 307/553

Primary Examiner—John Zazworsky
Attorney, Agent, or Firm—Rogers, Bereskin & Parr

[57] ABSTRACT

The clipping circuit has a voltage reference and a transconductance connected to a voltage input. The input is connected through the transconductance to an output resistor. The voltage output is taken between the output resistor and the transconductance. The voltage reference has a third current source feeding a diode connected transistor and a resistor. A second current source feeds into the resistor after the transistor. The base of the diode connected transistor is connected to the voltage input. The transconductance has a second transistor whose base is connected to the voltage input, collector sinks current from a fourth current source and emitter feeds current to a resistor. A first current source feeds current to a third transistor and to a current mirror. The base of the third transistor is connected between the fourth current source and the collector of the second transistor. The current mirror draws current from the output resistor and feeds current to between the emitter of the second transistor and its associated resistor. The transconductance creates a feed back loop such that a change in the first and second current sources creates a steady-state current drawn through the resistor that is one-half of the first current source current. The circuit produces symmetrical clipping of an input voltage signal at the voltage output.

21 Claims, 4 Drawing Sheets

CLIPPING CIRCUIT

FIELD OF THE INVENTION

This invention relates to clipping circuits. More particulary, it relates to such circuits for clipping signals substantially symmetrically.

BACKGROUND OF THE INVENTION

Clipping is the limiting of the amplitude of an output signal when an input signal is above a given amplitude. Typically clipping occurs when the amplitude of the output signal reaches one of the supply rails, or an output stage driving transistor reaches its maximum output current by going into saturation or reaching maximum drive current.

For many applications, especially audio applications, it is desirable that clipping be performed symmetrically. Asymmetrical clipping introduces even harmonics to the output signal. Even harmonics do not naturally occur in audio signals and their presence can produce noticeable distortion for a listener.

Where clipping occurs as a result of the output signal amplitude reaching a supply rail at a different amplitude, with respect to the normal bias point of the output stage, from the amplitude at which the driving transistor reaches its maximum output current asymmetrical clipping will occur.

As a result, most output stages for applications where symmetrical clipping is desirable set the output stage bias point to be midway between one supply rail and the output voltage when the driving amplifier reaches its maximum output current. Typically, an output stage will consist of a bipolar junction transistor (BJT) amplifier whose emitter is connected to one supply rail and whose collector is connected through a resistor to the other supply rail. The input to the output stage is a current at the base of the transistor, while the output of the output stage is at the collector of the transistor. The only factor limiting upward signal excursion, assuming the other supply rail is a positive supply rail, is the difference between the bias point at the output and the positive supply rail. This difference is easily controlled. On the other hand the factors limiting downward signal excursion are the current gain of the amplifier, the driving current at the base of the amplifier and the saturation point of the amplifier. These factors are processing sensitive and interdependent. In order to obtain substantially symmetrical clipping each factor is set up at the time of processing and cannot be adjusted thereafter. In order to change the amount of clipping it is necessary to have separately processed circuits with each of the factors set for each desired clipping level.

SUMMARY OF THE INVENTION

The invention provides a clipping circuit, comprising:
a) a voltage reference outputting a reference voltage;
b) a transconductance having a first current source of maximum drive current and outputting an output current; and
c) an input between the voltage reference and the transconductance for receiving an incoming signal; wherein, a change in the source of limited drive current is adapted to be matched with a change in the reference voltage such that a steady-state output current is substantially one-half of a maximum output current.

BRIEF DESCRIPTION OF THE DRAWINGS

For a better understanding of the present invention, and to show more clearly how it may be carried into effect, reference will now be made, by way of example, to the accompanying drawings, which show a preferred embodiment of the present invention, and in which.

DETAILED DESCRIPTION OF THE PREFERRED EMBODIMENT

Figure 1:
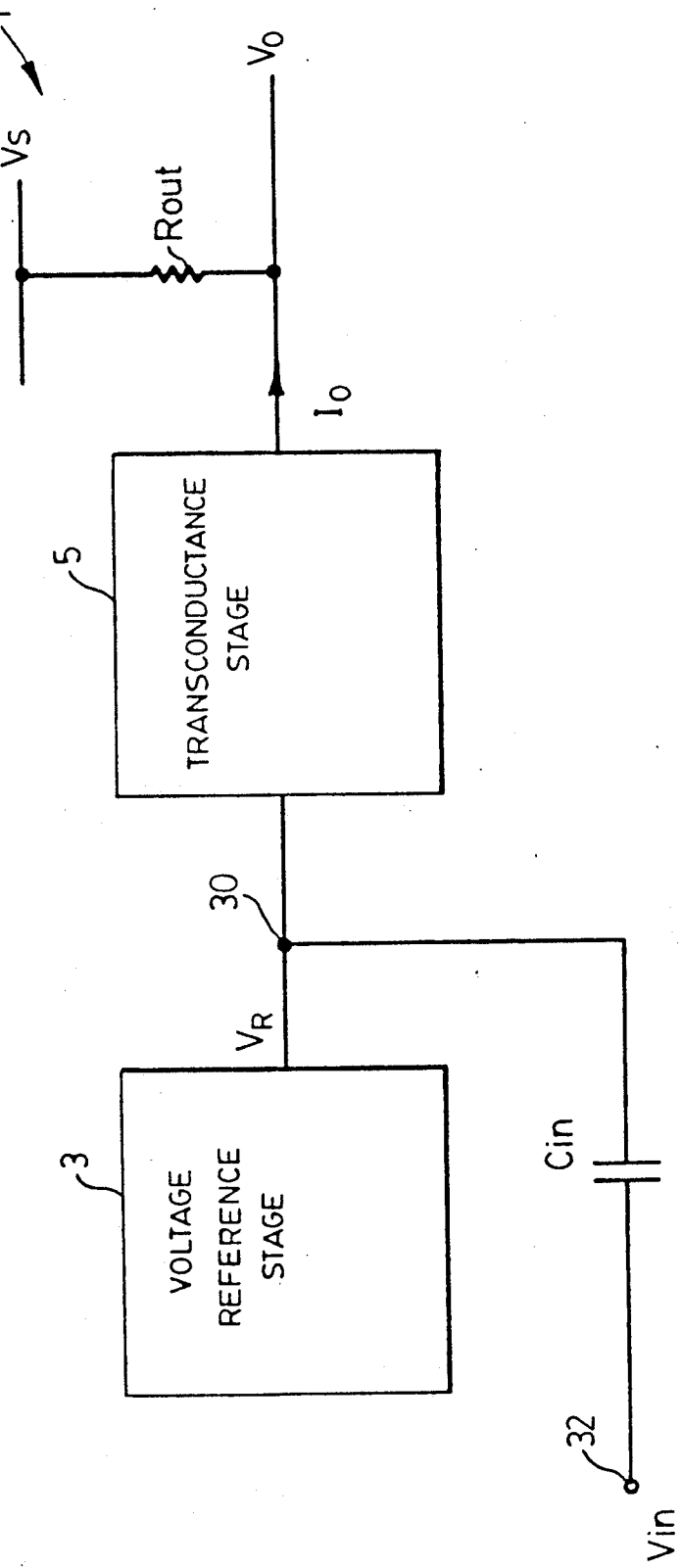
FIG. 1 is a block diagram of a clipping circuit according to the preferred embodiment of the present invention.

Referring to FIG. 1, the clipping circuit 1 has a voltage reference 3 and a transconductance 5. The voltage reference stage 3 and transconductance stage 5 are connected together and through a coupling capacitor $C_{in}$ to a voltage input $v_{in}$. The output of the transconductance 5 is connected through a resistor $R_{out}$ to a first supply rail $V_s$.

An output voltage, $V_o$, is between $R_{out}$ and the output of the transconductance 5. The transconductance 5 outputs a current $I_o$ as a function of the voltage input $V_{in}$ and includes a source of limited drive current $I_D$. $I_D$ is limited in the sense that it has a given maximum current. The voltage reference 3 outputs a reference voltage $V_R$.

$V_R$ and $I_D$ are matched so that a change in $V_R$ is matched by a change in $I_{Dmax}$ such that a bias output current $I_{obias}$ is substantially one-half of a maximum output current $I_{omax}$. The reference voltage $R_R$ sets the bias output current $I_{obias}$ of the circuit 1. It will be seen that a change in $V_{in}$ changes the input voltage to the transconductance stage 5, which will cause a change in the drive current $I_D$. As discussed, to ensure symmetrical clipping the circuit 1 modifies the output bias current $I_{obias}$ so that it remains substantially one-half of the maximum output current $I_{omax}$. The output voltage $V_o$ is equal to $V_s - R_{out} I_o$. During steady-operation, the output current $I_o$ equals the output bias current $I_{obias}$, and $V_{obias}$ is $V_s - I_{obias} R_{out}$. The maximum upward signal swing from $V_{obias}$, assuming $V_s$ is positive with respect to the output of the transconductance 5 and $I_o$ is negative, occurs when $I_{obias}$ is zero and is therefore $I_{obias} R_{out}$. The maximum downward signal swing from $V_{obias}$ is $I_{omax} R_{out} - I_{obias} R_{out}$. As $I_{max} = 2 I_{obias}$ the maximum downward signal swing from $V_{obias}$ is $I_{obias} R_{out}$. Thus the upward and downward signal swings are matched.

$R_{out}$ acts as a linear current controlled voltage source.

Figure 2:
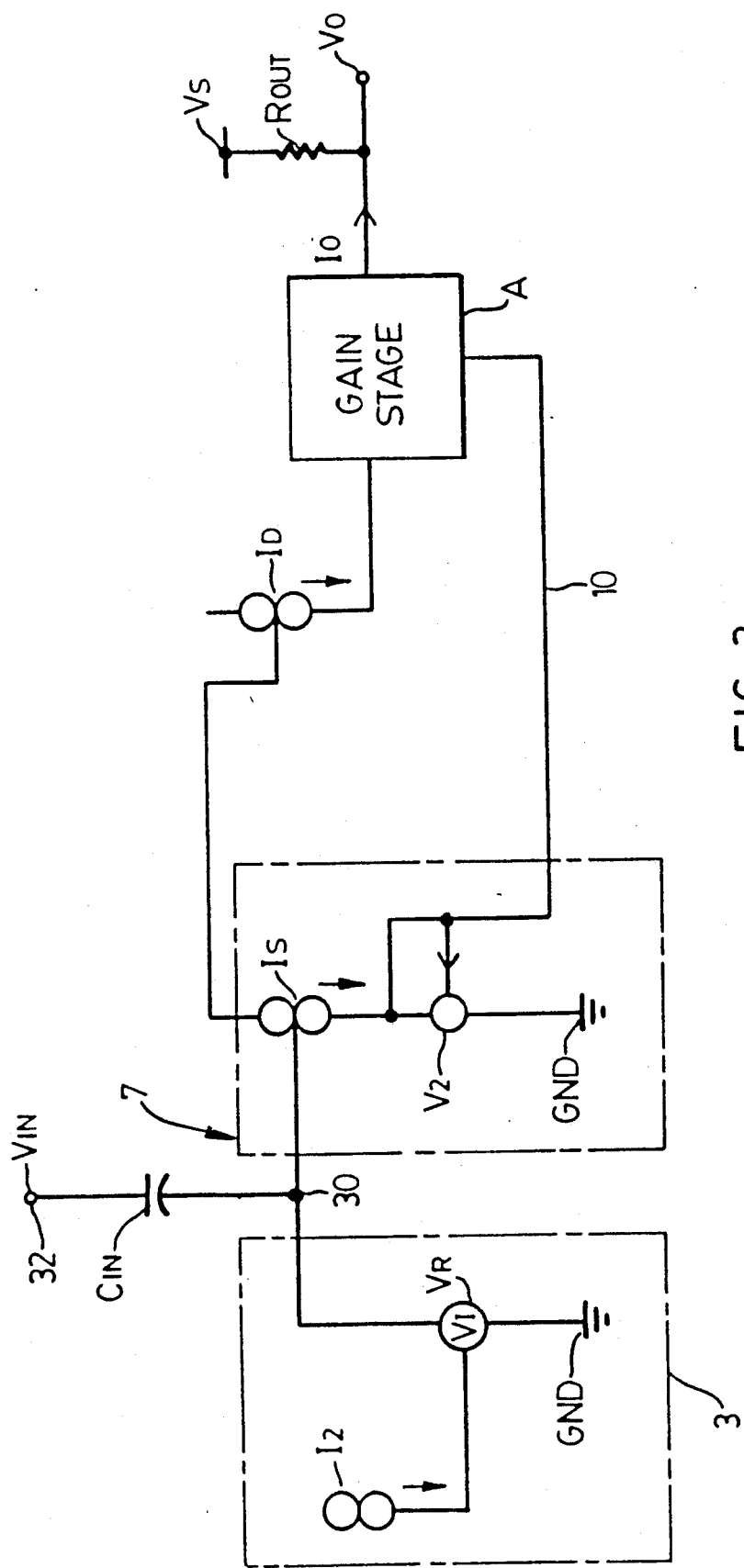
FIG. 2 is a circuit diagram of the clipping circuit of FIG. 1.

Referring to FIG. 2, the transconductance 5 may be implemented using a gain controlled block A between $I_D$ and $V_o$. The gain block A is driven by $I_D$. The gain of block A is controlled in that the gain is known and can be implemented using a substantially processing insensitive component.

As the gain of block A is controlled the relationship between the proportion of $I_D$ and the output current $I_o$ is not affected by processing.

Connected between the source of drive current $I_D$ and the voltage reference is a voltage to current converter 7 outlined in dashed lines. The voltage to current converter 7 determines the amount of drive current $I_D$ to be supplied to the controlled gain block A. The amount of drive current $I_D$ is one-half of the difference between maximum and minimum drive current when there is a steady-state signal at the input to the transconductance. Otherwise, the amount of drive current $I_D$ is proportional to the input to the transconductance unless the maximum or minimum drive current is reached.

For the simplest implementation the minimum drive current should be set to zero (i.e. the source of drive current is shut off) and the maximum output current $I_{omax}$ is twice the steady-state output current $I_{obias}$. When this happens $V_o$ swings between $V_s$ when the drive current is zero and $2R_{out}I_{obias}$ from $V_s$. This guarantees symmetrical clipping.

In order to communicate when the steady-state has been reached and what proportion of the maximum drive current is flowing, the controlled gain block A is connected back to the voltage to current converter 7. This connection provides a feedback loop 10.

The voltage reference 3 has a current controlled first voltage source $V_1$ connected between a second supply rail, in this case ground GND, and the output of the voltage reference $V_R$. The first voltage source $V_1$ is controlled by a second current source $I_2$.

The voltage to current converter 7 has a current controlled second voltage source $V_2$ and a voltage controlled current sink $I_s$. The current control input of the second voltage source $V_2$ is connected to the current sink $I_s$ to and the gain block A via the feedback loop 10. The voltage control of the current sink $I_s$ is connected between the second voltage source $V_2$ and the input to the transconductance 5. The current sink is connected to the source of driving current $I_D$.

In operation, based on the voltage input $V_{in}$ the voltage to current converter 7 determines the proportion of maximum drive current $I_D$ presently flowing from the gain block A and represented in part as the voltage drop across the second voltage source $V_2$. An increase in the second voltage source will decrease the voltage at the control input to the current sink $I_s$, thereby decreasing the current being sunk. This decreases the output of the voltage to current converter 7 and decreases the amount of drive current $I_D$. Additionally it decreases the sunk current flowing into the current control input of the second voltage source $V_2$. Accordingly, when the voltage input $V_{in}$ reaches a steady-state value the transconductance 5 will also reach a steady-state and drive current $I_D$ will also reach a steady-state.

Figure 3:
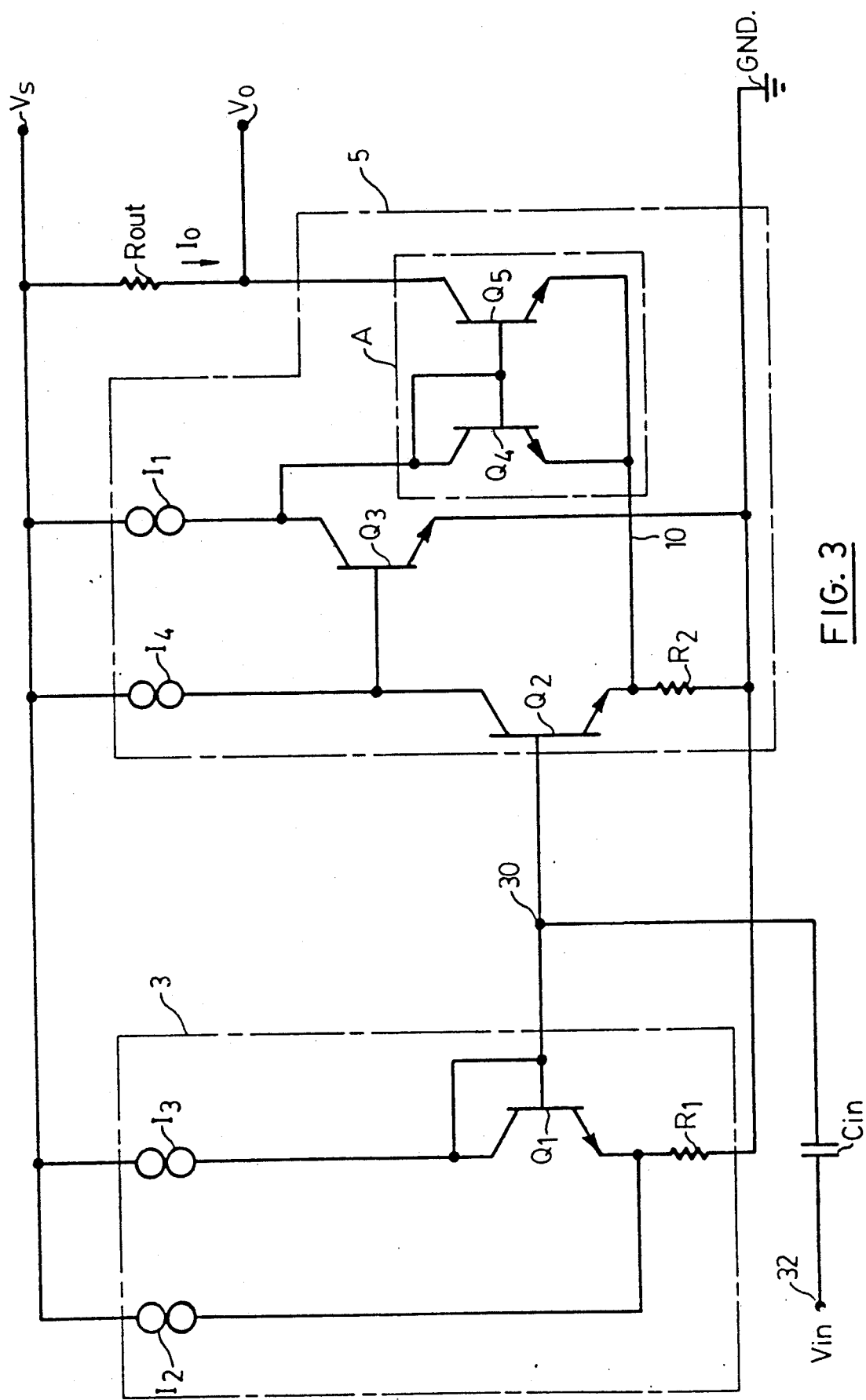
FIG. 3 is a detailed circuit diagram of the clipping circuit of FIG. 1.

Referring now to FIG. 3, the current controlled first voltage source $V_1$ has been implemented using a diode connected first BJT $Q_1$ fed by a third current source $I_3$ and connected through a first passive element to the second supply rail GND. The first passive element is a resistor $R_1$. The second current source $I_2$ is connected to $Q_1$ and $R_1$. The reference voltage $V_R$ is output at port 30, which also constitutes the input port for the transconductance stage 5. The signal input port for the circuit, for receiving $V_{in}$, is indicated at 32.

The voltage controlled current sink $I_s$ is a second BJT $Q_2$ whose base is connected via port 30 to the base of $Q_1$, the input voltage $V_{in}$ via the capacitor $C_{in}$, and emitter is connected to the controlled gain block A implemented by $Q_4$ and $Q_5$ as will be later described.

The current controlled second voltage source $V_2$ is a passive element, in this case a resistor $R_2$, connected between the emitter of $Q_2$ and ground.

The source of driving current $I_D$ has a first current source $I_1$, fourth current source $I_4$, and a third BJT $Q_3$. $I_4$ is connected to the collector of $Q_2$ and the base of $Q_3$. $I_1$ is connected to the collector of $Q_3$. The emitter of $Q_3$ is connected to ground.

The controlled gain block A has current mirror connected fourth and fifth BJTs $Q_4$, $Q_5$. The collector of $Q_4$ is connected to $I_1$ and the collector of $Q_5$ is connected to the output voltage $V_o$. The emitters of $Q_4$, $Q_5$ are connected to the emitter of $Q_2$.

In operation, the collector current of $Q_5$ is the output current $I_o$. As previously discussed the condition of operation for symmetry is $I_{obias} = \frac{1}{2}I_{omax}$. To show how the circuit of FIG. 3 achieves this condition it is assumed for simplicity that the gain block A has a gain of 1. A current mirror was used to implement the gain block A as the gain of a current mirror is easily controlled during processing by fixing the ratio of the physical areas of the BJTs. It is further assumed that $I_4$ is approximately equal to $I_3$, $Q_1$ and $Q_2$ having substantially the same gain and $R_1$ has substantially the same resistance as $R_2$.

$I_3$ will flow through $Q_1$ and $I_3$ and $I_2$ will flow through $R_1$. It will be evident that the voltage drop across the resistor $R_1$ and the emitter junction of $Q_1$ creates the reference voltage at the base of $Q_1$.

Looking at the transconductance 5, as the gain of the current mirror comprising the gain block A is unity, the current flowing in the collectors of $Q_4$ and $Q_5$ will be substantially the same. The maximum drive current flowing into the gain block A will be $I_1$, i.e. when $Q_3$ shuts off. Therefore $I_{omax}$ is substantially equal to $I_1$.

It will be seen that by applying an input voltage $V_{in}$, the circuit 1 is biased and the resultant current flowing in the feedback loop 10 from the gain block A is $2I_1$ or $2I_{obias}$. Symmetrical clipping, i.e. $I_{obias} = \frac{1}{2}I_{omax}$, is achieved by making the current source $I_1$ substantially equal to the current source $I_2$. Applying the well-known Kirchhoff's Voltage Law around the emitter-base loop of transistors $Q_1$ and $Q_2$, the following expression is obtained:

$$-V_{R1} - V_{BE1} + V_{BE2} + V_{R2} = 0$$

Since $I_3$ is substantially the same as $I_4$, and $Q_1$ and $Q_2$ are matched, the $V_{be}$'s of $Q_1$ and $Q_2$ will be substantially the same and drop out the above expression. Then, $V_{R1}$ is equal to VR2, and applying the well-known Ohm's Law, the following expression is obtained:

$$(I_2 + R_3)R_1 = (I_4 + 2I_1)R_2$$
$$(I_2 + I_3)R_1 = (I_4 + 2I_{obias})R_2$$

Since, $R_1$ is substantially the same as $R_2$, and $I_3$ is substantially the same as $I_4$, the above expression reduces to $2I_{obias} = I_2$. Therefore, if $I_1$ is substantially equal to $I_2$, then $I_{obias}$ is equal to $\frac{1}{2}I_1$ or $\frac{1}{2}I_{Dmax}$.

Should $I_{obias}$ not substantially equal twice $I_2$ then the voltage across $R_2$ will be too high to too low. Should it be too low $Q_2$ will turn on harder, drawing current away from the base of $Q_3$. Less current will flow from $I_1$ into $Q_3$ and more into the gain block A. More current will flow out of the gain block A into $R_2$ to raise the voltage across $R_2$ until $I_{obias}$ reaches $\frac{1}{2}I_2$. The opposite effect will occur when the voltage across $R_2$ is too high.

Thus if $I_1$ is substantially the same as $I_2$ then $I_{obias}$ will be one-half of $I_{omax}$.

The gain of $Q_3$ must be sufficiently high to not draw away significant current from $Q_2$ affecting the mirroring process. $Q_3$ acts as a current controlled current sink sinking current away from $I_1$. It will be seen that $Q_2$ and $Q_3$ act together as a steering circuit, controlling how current $I_1$ is divided between current sink $Q_3$, and gain stage A. It will also be seen that $Q_4$ and $Q_5$ are a current-controlled current amplifier with predictable gain, i.e. $Q_4$ receives a controlled current (all or part of $I_1$) and $Q_4$, $Q_5$ each output a current which is proportional to the current received by $Q_4$.

It is possible to make devices where $I_{obias}$ is substantially one-half of $I_{omax}$ without having $I_1$ and $I_2$, $I_3$ and $I_4$, $R_1$ and $R_2$, $Q_1$ and $Q_2$, and $Q_4$ and $Q_5$ substantially the same. It is important though to match these components to ensure the ultimate circuit 1 does meet the $I_{obias}$ is substantially one-half $I_{omax}$ criterion.

For example, where $Q_5$ has twice the gain of $Q_4$ the gain of the gain block A will be approximately 2. $I_{omax}$ will be twice $I_1$. As discussed, to achieve symmetrical clipping $I_{obias}$ must be $\frac{1}{2}I_{omax}$ and therefore $I_{obias}$ must be equal to $I_1$. At equilibrium $I_2$ must be set to 1.5 $I_1$. In these circumstances $I_2$ should equal one-half the gain of the gain block A plus one-half, multiplied by $I_1$.

Other matching of the components will be evident to those skilled in the art.

Another advantage of the circuit 1 is that the small signal voltage gain is independent of the clipping level. For a change in $V_{in}$, the $V_{be}$ of $Q_2$ will lag behind the change causing the voltage across $R_2$ to change. The change in the voltage across $R_2$ will draw a proportionally different current through the gain block A into $R_2$. This changes $I_o$ by one-half the change in the current in the gain block A. $V_o$ will change by a factor of $R_{out}$ times the change in $I_o$. Thus the small signal gain of the circuit is approximately $$\frac{R_{out}\, \alpha}{R_2 (1 + \alpha)},$$

where $\alpha$ is the gain of the gain block A.

Figure 4:
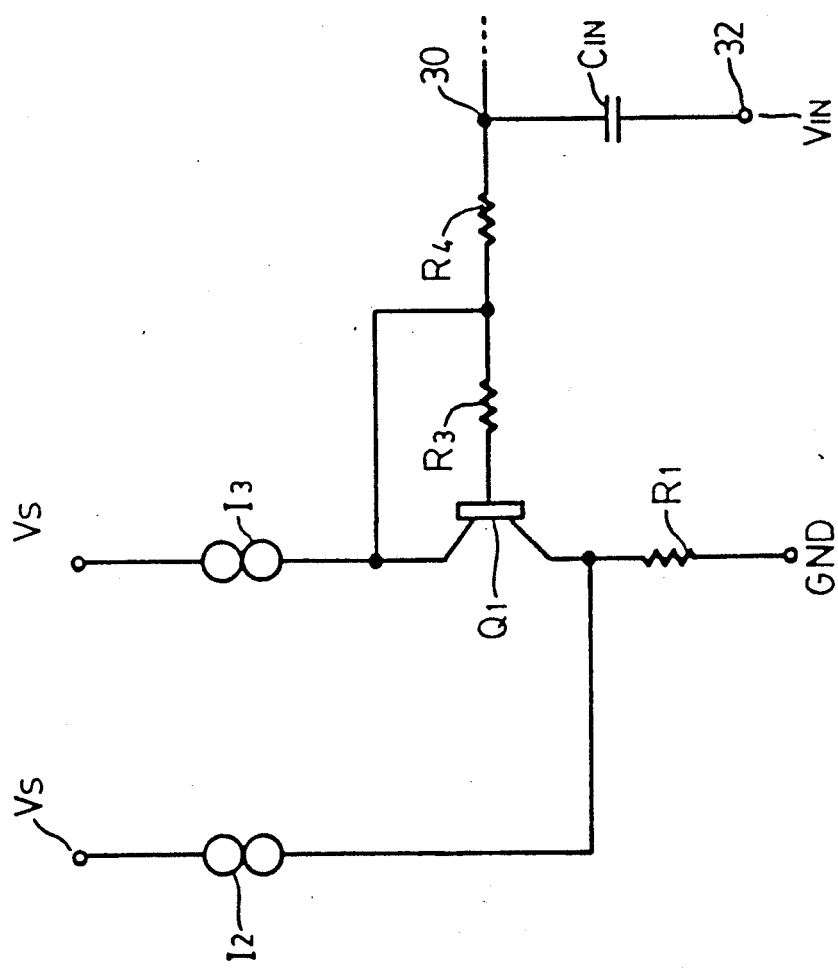
FIG. 4 is a circuit diagram of the voltage reference stage with added input impedance.

Referring now to FIG. 4, resistor $R_3$ between the base and collector of $Q_1$, and resistor $R_4$ between the collector of $Q_1$ and the connection of the coupling capacitor $C_{in}$ and the base of $Q_2$, may be added to increase the input impedance seen by $V_{in}$. $R_3$ and $R_4$ should be matched, and for simplest implementation be substantially the same, to keep the mirroring effect of $Q_1$ and $Q_2$.

Other embodiments of the present invention will be evident to those skilled in the art and fall within its spirit and scope, as defined by the following claims.

I claim:

1. A clipping circuit, comprising:
   (a) a voltage reference stage having generating means for producing a reference voltage and an output port connected to said generating means for outputting said reference voltage;
   (b) a transconductance stage having control means coupled to said output port of said voltage reference stage, a first current source coupled to said control means, said first current source including means for generating a drive current having a first pre-determined value;
   (c) said transconductance stage further including a gain stage coupled to said first current source for receiving current therefrom, said gain stage also being coupled to said control means;
   (d) an input port for receiving an input signal, said input port being coupled to said output port of said voltage reference stage and to said control means;
   (e) said control means including means responsive to said input signal for controlling the amount of said drive current flowing from said first current source to said gain stage;
   (f) said gain stage including means responsive to the amount of said drive current received thereby for generating an output current proportional to the amount of said drive current received by said gain stage and for said output current of said gain stage to have a pre-determined maximum value proportional to said first pre-determined value;
   (g) and bias means, including feedback means connected to said control means, for biasing said control means to control said gain stage for said output current of said gain stage to have, in the absence of any input signal, a steady-state value which is substantially one-half of said pre-determined maximum value.

2. A circuit according to claim 1, wherein said second pre-determined maximum value of said output current is substantially equal to said first pre-determined value.

3. A circuit according to claim 1, wherein said negative feedback means comprise means connected from said gain stage to said control means for feeding back to said control means a current which is proportional to said output current.

4. A circuit according to claim 3, wherein the voltage reference stage includes a second current source and a first current controlled voltage source coupled to said output port and connected to said second current source for generating said reference voltage.

5. A circuit according to claim 4, wherein said control means includes a voltage controlled current sink coupled to said output port, a second current controlled voltage source connected to said voltage controlled current sink and to said negative feedback means, said second voltage controlled current sink including means coupled to said first current source and responsive to the voltage difference between said second current controlled voltage source and said output port for causing said control means to sink current from said first current source in proportion to said voltage difference.

6. A circuit according to claim 5 including a pair of voltage supply rails, wherein said voltage reference stage includes a third current source, said first current controlled voltage source comprising a first passive element having two terminals, and a diode connected first bi-polar junction transistor with its base connected to said output port and to said third current source and with its emitter connected to the first terminal of said first passive element and to said second current source, and the second terminal of said first passive element being connected to one of said supply rails.

7. A circuit according to claim 6, wherein said second current controlled voltage source comprises a second passive element having two terminals, said transconductance stage includes a fourth current source and said voltage controlled current sink comprises a second bi-polar junction transistor having its base connected to said output port and its collector connected to said fourth current source and coupled to said first current source and its emitter connected to one terminal of said second passive element and to said feedback means, and the other terminal of said second passive element is connected to one of said supply rails.

8. A circuit according to claim 7, wherein said first and second bipolar junction transistors have substantially the same gain, said first and second passive elements are resistors having substantially the same resistances, and the current in said first and second current sources are substantially the same.

9. A circuit according to claim 7, wherein the current in said second current source is substantially equal to the current in said first current source multiplied by one-half of the gain of the gain stage plus one-half.

10. A circuit according to claim 7, wherein the gain of said gain stage is substantially equal to one and the currents in said first and second current sources are substantially the same.

11. A circuit according to claim 10, wherein said control means includes a current controlled current sink coupled to said voltage controlled current sink and to said first current source and having means for sinking current from said first current source and for receiving an output current from said voltage controlled current sink.

12. A circuit according to claim 11, wherein said current controlled current sink is a bi-polar junction transistor with its collector connected to said first current source and coupled to said gain stage and with its base connected to the collector of said second bi-polar junction transistor and to said fourth current source and with its emitter connected to one of said supply rails.

13. A circuit according to claim 12, wherein said gain stage is a current mirror having means for receiving current from said first current source and for producing mirror output current from said transconductance stage and for sending current received from said first current source and said output current to said feedback means.

14. A circuit according to claim 13, wherein said gain stage comprises a diode connected fourth bi-polar junction transistor and a fifth bi-polar junction transistor, the base and collector of said fourth bi-polar junction transistor connected to the base of said fifth bi-polar junction transistor, the emitters of said fourth and fifth bi-polar junction transistors being connected to said feedback means, and the collector of said fourth bi-polar junction transistor being connected to said first current source and to the collector of said current controlled current sink.

15. A circuit according to claim 14, wherein the gains of said fourth and fifth bi-polar junction transistors are substantially the same.

16. A circuit according to claim 14, further comprising a substantially linear current controlled voltage source, and a circuit output port, said linear current controlled voltage source connected between the other one of said supply rails and the collector of said fifth bi-polar junction transistor, and said circuit output port being connected to the collector of said fifth bi-polar junction transistor.

17. A circuit according to claim 16, wherein said linear controlled voltage source comprises a third resistor.

18. A circuit according to claim 17, wherein the gain of the circuit is $$\frac{R_{out}}{R_2(1+g)}$$

where,
$R_{out}$ is the resistance of said third resistor element, $R_2$ is the resistance of said second passive element, and
g is the gain of said gain stage.

19. A circuit according to claim 17, wherein said voltage reference stage further includes a fourth resistor and a fifth resistor, said fourth resistor being connected between the base and the collector of said first bi-polar junction transistor, and said fifth resistor being connected between the collector of the first bi-polar junction transistor and said output port of said reference voltage stage.

20. A circuit according to claim 19, wherein said fourth and fifth resistors have substantially the same resistance.

21. A circuit according to claim 1, further including a coupling capacitor and a circuit input, said coupling capacitor being connected between said circuit input and input port.

* * * * *